United States Patent [19]

Oguri et al.

[11] Patent Number: 4,629,618
[45] Date of Patent: Dec. 16, 1986

[54] BOEHMITE

[75] Inventors: Yasuo Oguri, Belmont, Mass.; Junji Saito, Yokohama; Naoto Kijima, Machida, both of Japan

[73] Assignee: Mitsubishi Chemical Industries Ltd., Tokyo, Japan

[21] Appl. No.: 840,543

[22] Filed: Mar. 17, 1986

Related U.S. Application Data

[63] Continuation of Ser. No. 641,722, Aug. 17, 1984, abandoned.

[30] Foreign Application Priority Data

Aug. 23, 1983 [JP] Japan .................................. 58-153466

[51] Int. Cl.4 .............................................. C01F 7/02
[52] U.S. Cl. .................................................. 423/625
[58] Field of Search ................................ 423/625, 628

[56] References Cited

U.S. PATENT DOCUMENTS

| | | | |
|---|---|---|---|
| 4,117,105 | 9/1978 | Hertzenberg et al. | 423/625 |
| 4,154,812 | 5/1974 | Sanchez et al. | 423/625 |
| 4,224,302 | 9/1980 | Okamoto et al. | 423/625 |
| 4,344,928 | 8/1982 | Dupin et al. | 423/625 |
| 4,360,449 | 11/1982 | Oberlander et al. | 423/625 |
| 4,492,682 | 1/1985 | Trebillon | 423/625 |
| 4,505,866 | 3/1985 | Oguri et al. | |

FOREIGN PATENT DOCUMENTS 1065733  4/1967  United Kingdom .............. 423/625

OTHER PUBLICATIONS

Bugosh et al., "Industrial & Engineering Chem.", vol. 1, No. 3, Sep. 1962, pp. 157–161.
Wefers et al., "Technical Paper No. 19", Alcoa Research Labs., E. St. Louis, Ill., 1972, pp. 15, 19, 20.

Primary Examiner—H. T. Carter
Attorney, Agent, or Firm—Oblon, Fisher, Spivak, McClelland & Maier

[57]  ABSTRACT

A boehmite having a crystal form wherein the ratio of the maximum length in the direction of the a-axis to the distance between the opposing crystal faces perpendicular to the c-axis is at least 10.

2 Claims, 4 Drawing Figures

BOEHMITE

This application is a continuation of application Ser. No. 641,722, filed Aug. 17, 1984, now abandoned.

The present invention relates to a boehmite having a novel crystal form.

A boehmite is obtainable by the hydrothermal treatment of an aqueous slurry of a boehmite-forming compound such as gibbsite, and has a characteristic crystal form.

FIG. 1 is a schematic view illustrating the crystal form of the conventional boehmite. The boehmite belongs to an orthorhombic system. However, the crystal faces constituting the external form of the crystal are (110), (110) and (001), whereby the interfacial angle between (110) and (110) faces is 76° or 104°, and the interfacial angle between (110) and (001) faces and the interfacial angle between (110) and (001) faces are 90°. The a-axis is parallel to (001) face and coincides with a bisector of the interfacial angle of 104° between (110) and (110) faces. The b-axis is parallel to (001) face and coincides with a bisector of the interfacial angle of 76° between (110) and (110) faces.

As shown in the scanning electron micrograph (8000 magnifications) of FIG. 2, in the conventional boehmite, (001) crystal face has a diamond or rhombic shape, and (110) and (110) crystal faces are rectangular, and the external form of the entire crystal is monoclinic prismatic.

The present invention is to provide a boehmite having a novel crystal form which is entirely different from the conventional boehmite.

Namely, the present invention provides a boehmite having a crystal form wherein the ratio of the maximum length in the direction of the a-axis to the distance between the opposing crystal faces perpendicular to the c-axis is at least 10.

Now, the present invention will be described in detail. In the accompanying drawings, FIG. 1 is a schematic view illustrating the crystal form of the conventional boehmite.

Figure 1:
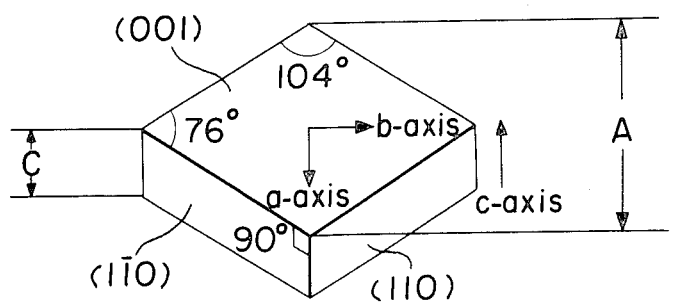
Figure 3:
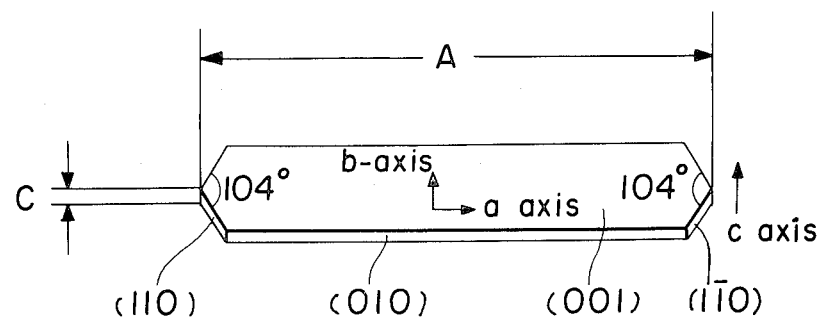
FIG. 3 is a schematic view illustrating the crystal form of the boehmite of the present invention.

The boehmite of the present invention is characterized by the ratio of the maximum length in the a-axis (i.e. length A as shown in FIGS. 1 and 3) to the distance between the opposing crystal faces perpendicular to the c-axis (i.e. length C as shown in FIGS. 1 and 3).

Figure 2:
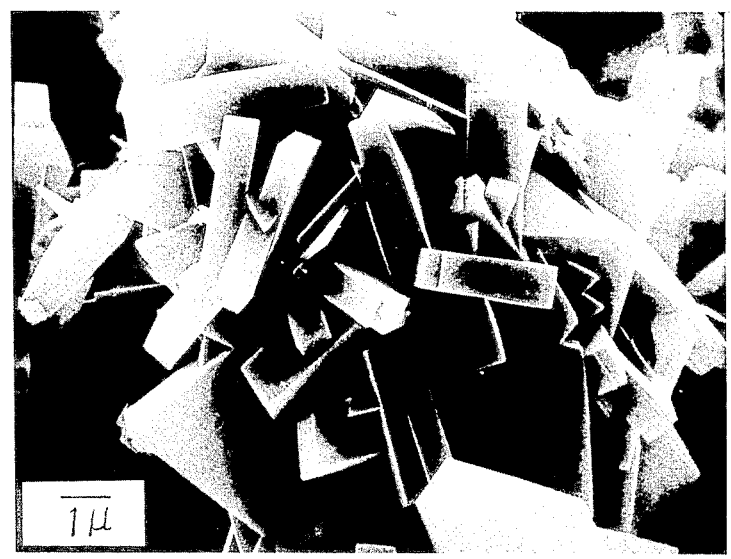
FIG. 2 is a scanning type electron micrograph (8000 magnifications) showing the crystal form of the conventional boehmite.
Figure 4:
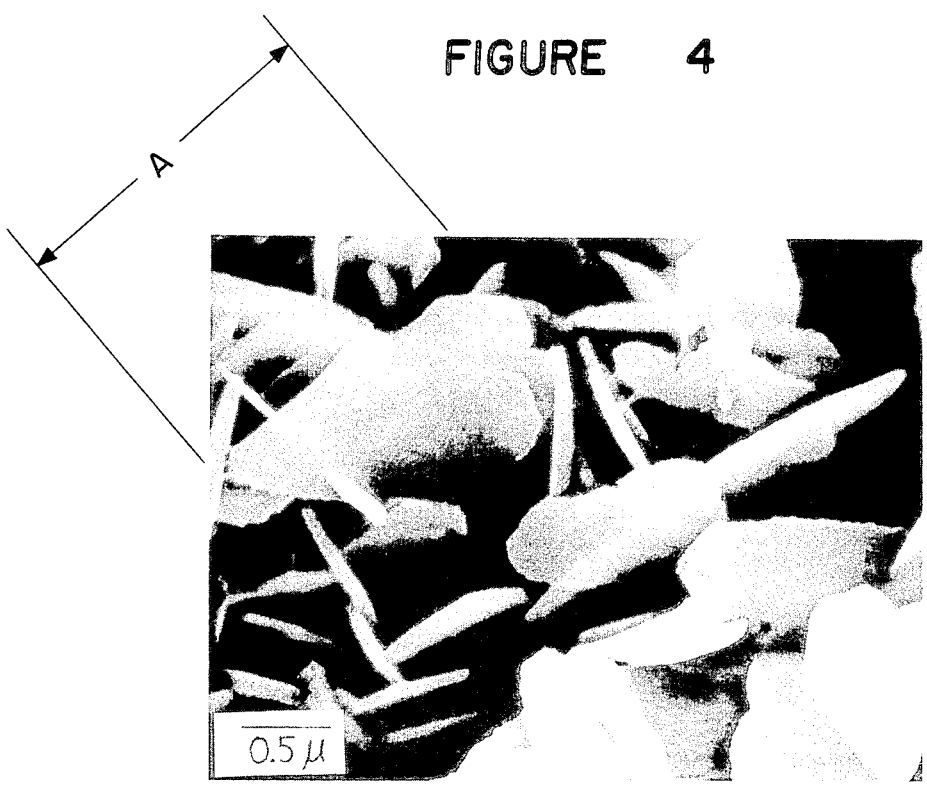
FIG. 4 is a scanning electron micrograph (28000 magnifications) showing the crystal form of the boehmite of the present invention.

Referring to FIGS. 1 and 2, in the conventional boehmite, the ratio of the length A to the length C is at most 5. Whereas, as shown in FIGS. 3 and 4, the boehmite of the present invention has a ratio of A/C being at least 10, and the length A is substantially longer than that of the conventional boehmite. The boehmite of the present invention is extremely grown in the direction of the a-axis, and has (010) crystal faces which do not appear on the crystal form of the conventional boehmite. Further, the boehmite of the present invention is characterized by the length A. Heretofore, with respect to a pseudo-boehmite, there has been produced a product having the ratio of A/C being at least 10 and the length A being at least 2000 Å. However, no boehmite has been produced which has the ratio of A/C being at least 10 and the length A being at least 2000 Å. In the conventional boehmite, a product having the length A of at least 2000 Å is a boehmite having the ratio of A/C being at most 5. Whereas, in the boehmite of the present invention, the ratio of A/C is at least 10, and at the same time, the length A is at least 2000 Å.

The boehmite of the present invention may be prepared in the following manner. Namely, the boehmite of the present invention may be readily obtained by subjecting an aqueous slurry of a boehmite-forming compound to hydrothermal treatment in the presence of a calcium compound and an organic compound having an alcoholic hydroxyl group, in the slurry.

As the boehmite-forming compound, there may be employed an aluminum-containing compound capable of forming a boehmite under the condition for hydrothermal treatment at a temperature of at least 100° C., such as gibbsite, bayerite or ρ-alumina.

The amount of the water to form an aqueous slurry is usually selected within a range of from 30 to 300 parts by weight relative to 100 parts by weight of the boehmite-forming compound. If the amount of the water is too small, the viscosity of the aqueous slurry tends to be too high, whereby the operation such as stirring tends to be difficult. On the other hand, if the amount of water is too great, an unnecessary great amount of heat energy will be wasted during the hydrothermal treatment, such being uneconomical.

As the calcium compound, there may be employed a calcium compound capable of supplying calcium ions in the aqueous slurry during the hydrothermal treatment, such as CaO, $Ca(OH)_2$ or $CaAl_2O_4$. The amount of the calcium compound is usually selected within a range of from 0.05 to 20 parts by weight, preferably from 0.1 to 10 parts by weight, as calculated as Ca relative to 100 parts by weight of the boehmite-forming compound as calculated as $Al_2O_3$.

As the organic compound having an alcoholic hydroxyl group, various organic compounds may be employed. However, it is usual to employ those having a boiling point higher than the temperature for the hydrothermal treatment. Although it is possible to employ a compound having one hydroxyl group, it is preferred to use a compound having at least two hydroxyl groups. As specific examples, there may be mentioned ethylene glycol, polyvinyl alcohol and hydroxy ethyl cellulose. The amount of such a compound is selected within a range of from 0.01 to 100 parts by weight, preferably from 0.1 to 50 parts by weight relative to 100 parts by weight of the boehmite-forming compound as calculated as $Al_2O_3$.

The hydrothermal treatment is conducted at a temperature of from 100° to 400° C., preferably from 150 to 300° C. under a pressure of from 1 to 1000 kg/cm²G, preferably from 5 to 100 kg/cm²G for from 0.1 to 100 hours, preferably from 1 to 10 hours.

The boehmite may be used, for instance, as a heat-insulating material in the form of a shaped product. The shaped product made of the boehmite of the present invention has the following advantages. Namely, the boehmite of the present invention has a ratio of A/C being substantially greater than that of the conventional boehmite, and accordingly, when such a boehmite is molded into a shaped product, the intertwining of the boehmite crystals with one another is firm, whereby, the shaped particle has high strength. Accordingly, in order to provide the same level of strength to the shaped product, it is possible to obtain a shaped product having a lower bulk density than the conventional boehmite. In general, when a shaped product is used as a heat insulating material, the lower the bulk density of the shaped product, the better the heat-insulating property.

As mentioned above, a pseudo-boehmite has been known to have a high A/C ratio. However, a shaped product thereof undergoes substantial shrinkage when heated for conversion to alumina, and it is not suitable for application to heat insulating materials. Whereas, the boehmite of the present invention has good crystallinity and undergoes no substantial shrinkage when heated. Thus, when used as a heat insulating material there is no disadvantage as mentioned above.

As a method for producing a shaped product made of the boehmite of the present invention, there may be mentioned a method wherein an aqueous slurry comprising a boehmite-forming compound, a calcium compound and an organic compound having an alcoholic hydroxyl group is molded, followed by hydrothermal treatment, or a method wherein this aqueous slurry is subjected to hydrothermal treatment, followed by molding. In the boehmite shaped product thus obtained, substantially the total amount of crystals constituting the shaped product has the abovementioned specific crystal form, and this the shaped product exhibits superior effects as an heat insulating material, as mentioned above.

Now, the present invention will be described in further detail with reference to an Example.

EXAMPLE 1

100 parts by weight of gibbsite, 1.6 parts by weight of calcium hydroxide and 100 parts by weight of an aqueous solution containing 10% of polyvinyl alcohol, were stirred at room temperature to obtain an aqueous slurry.

This slurry was injected into a mold and subjected to hydrothermal treatment at 200° C. under pressure of 15 kg/cm$^2$G for 4 hours. Then, the treated product was dried at 100° C. for 24 hours to obtain a boehmite. The scanning electron micrograph (28000 magnifications) of the boehmite thus obtained, is shown in FIG. 4.

As shown in FIG. 4, the crystal form of the boehmite is such that the distance between the opposing crystal faces perpendicular to the c-axis (length C) is about 800 Å, and the maximum length in the direction of the a-axis (length A) is about 18000 Å in an average, and the ratio of the latter to the former is 22.5.

We claim:

1. A boehmite having an orthorhombic crystal form in which the length in the direction of the a-axis of the crystal is about 18,000 Å, the length of the direction of the c-axis of the crystal is about 800 Å, and the ratio of the length of the a-axis to the length of the c-axis is about 22.5, prepared by the process comprising:
    hydrothermally treating an aqueous slurry of gibbsite in the presence of calcium hydroxide and polyvinyl alcohol.

2. The boehmite of claim 1, wherein said hydrothermal treatment is conducted at a temperature of 200° C. at a pressure of 15 kg/cm$^2$G.

* * * * *